US008115115B2

(12) United States Patent
Bleich et al.

(10) Patent No.: US 8,115,115 B2
(45) Date of Patent: Feb. 14, 2012

(54) METHODOLOGY OF CO-INTERFERENCE REDUCTION THROUGH CABLE SEPARATION AND SHIELDING WITHIN A GAMING MACHINE

(75) Inventors: Charles R. Bleich, Cary, IL (US); Victor Mercado, Berwyn, IL (US); James M. Shird, Chicago, IL (US)

(73) Assignee: WMS Gaming Inc., Waukegan, IL (US)

( * ) Notice: Subject to any disclaimer, the term of this patent is extended or adjusted under 35 U.S.C. 154(b) by 418 days.

(21) Appl. No.: 12/447,220

(22) PCT Filed: Oct. 29, 2007

(86) PCT No.: PCT/US2007/022855
§ 371 (c)(1),
(2), (4) Date: Apr. 24, 2009

(87) PCT Pub. No.: WO2008/057326
PCT Pub. Date: May 15, 2008

(65) Prior Publication Data

US 2009/0318237 A1 Dec. 24, 2009

Related U.S. Application Data

(60) Provisional application No. 60/857,754, filed on Nov. 8, 2006.

(51) Int. Cl.
*H05K 9/00* (2006.01)

(52) U.S. Cl. .......................... 174/382; 174/68.3; 463/46

(58) Field of Classification Search .................. 174/382, 174/387, 51, 68.2, 68.3; 463/46
See application file for complete search history.

(56) References Cited

U.S. PATENT DOCUMENTS

| | | | | |
|---|---|---|---|---|
| 5,466,886 | A | 11/1995 | Lengyel et al. | 174/48 |
| 6,972,368 | B2 | 12/2005 | VanderVelde | 178/48 |
| 7,040,626 | B2 | 5/2006 | Seelig et al. | 273/309 |
| 7,060,892 | B2 | 6/2006 | Whidden | 174/34 |
| 7,896,746 | B2 * | 3/2011 | Borissov | 463/46 |
| 2001/0027132 | A1 * | 10/2001 | Nagata et al. | 463/46 |
| 2003/0027627 | A1 | 2/2003 | Cole | 463/20 |
| 2004/0029641 | A1 * | 2/2004 | Borg | 463/46 |
| 2004/0142753 | A1 * | 7/2004 | Beadell et al. | 463/46 |
| 2004/0185938 | A1 * | 9/2004 | Moore et al. | 463/46 |
| 2005/0178572 | A1 | 8/2005 | Halbert | 174/50 |
| 2006/0178204 | A1 * | 8/2006 | Okada | 463/20 |
| 2008/0182642 | A1 * | 7/2008 | Cole | 463/20 |

OTHER PUBLICATIONS

PCT International Search Report for International Application No. PCT/US2007/022933 dated May 15, 2008 (2 pages).
PCT Written Opinion for International Application No. PCT/US2007/022933 dated May 15, 2008 (5 pages).
PCT International Search Report for International Application No. PCT/US2007/022855 dated Apr. 7, 2008 (2 pages).
PCT Written Opinion for International Application No. PCT/US2007/022855 dated Apr. 7, 2008 (5 pages).

* cited by examiner

*Primary Examiner* — Hung Ngo
(74) *Attorney, Agent, or Firm* — Nixon Peabody LLP

(57) ABSTRACT

According to one aspect of the present invention, a gaming machine for conducting a wagering game comprises a gaming cabinet having a first member and a second member. The first member is located physically separate from the second member. The gaming machine further comprises a plurality of high-voltage wires generally located within the first member. The gaming machine additionally includes a plurality of low-voltage wires generally located within the second member. The first member and the second member shielding the respective plurality of high-voltage wires and low-voltage wires to reduce electrical interference between the plurality of high-voltage wires and the plurality of low-voltage wires.

20 Claims, 8 Drawing Sheets

METHODOLOGY OF CO-INTERFERENCE REDUCTION THROUGH CABLE SEPARATION AND SHIELDING WITHIN A GAMING MACHINE

CROSS REFERENCE TO RELATED APPLICATIONS

This application is a U.S. national stage of International Application No. PCT/US2007/022855, filed Oct. 29, 2007, which is related to and claims priority to U.S. Provisional Application No. 60/857,754, filed Nov. 8, 2006, which is incorporated herein its entirety.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates generally to gaming machines, and methods for manufacturing gaming machines. More specifically, the present invention relates to gaming machines having certain wires separated from others and methods for manufacturing such gaming machines.

BACKGROUND OF THE INVENTION

Gaming machines, such as slot machines, video poker machines and the like, have been a cornerstone of the gaming industry for several years. Generally, the popularity of such machines with players is dependent on the likelihood (or perceived likelihood) of winning money at the machine and the intrinsic entertainment value of the machine relative to other available gaming options. Where the available gaming options include a number of competing machines and the expectation of winning at each machine is roughly the same (or believed to be the same), players are likely to be attracted to the most entertaining and exciting machines. Shrewd operators consequently strive to employ the most entertaining and exciting machines, features, and enhancements available because such machines attract frequent play and hence increase profitability to the operator. Therefore, there is a continuing need for gaming machine manufacturers to continuously develop new games and improved gaming enhancements that will attract frequent play through enhanced entertainment value to the player.

One concept that has been successfully employed to enhance the entertainment value of a game is the concept of a "secondary" or "bonus" game that may be played in conjunction with a "basic" game. The bonus game may comprise any type of game, either similar to or completely different from the basic game, which is entered upon the occurrence of a selected event or outcome in the basic game. Generally, bonus games provide a greater expectation of winning than the basic game and may also be accompanied with more attractive or unusual video displays and/or audio. Bonus games may additionally award players with "progressive jackpot" awards that are funded, at least in part, by a percentage of coin-in from the gaming machine or a plurality of participating gaming machines. Because the bonus game concept offers tremendous advantages in player appeal and excitement relative to other known games, and because such games are attractive to both players and operators, there is a continuing need to develop gaming machines with new types of bonus games to satisfy the demands of players and operators.

Gaming machines typically include a gaming cabinet, which generally surrounds the interior of the gaming machine and is viewable by the players. A plurality of wires are typically included in the interior of the gaming machine, which helps distribute power, signal communications, and operational control of the gaming machine. The plurality of wires include AC wires and DC wires (e.g., signal wires, input/output wires, etc.). Some current gaming machines have AC wires that are disposed generally in the same area within the interior of the gaming cabinet as the DC wires. Some problems associated with this type of wire arrangement is that it can cause electromagnetic interference, electrostatic discharge, and other undesirable effects, such as potential shock hazards caused by wire shorts.

It would be desirable to provide an improved wiring system that assists in addressing one or more of the above disadvantages.

SUMMARY OF THE INVENTION

According to one aspect of the present invention, a gaming machine for conducting a wagering game comprises a gaming cabinet having a first member and a second member. The first member is located physically separate from the second member. The gaming machine further comprises a plurality of high-voltage wires generally located within the first member. The gaming machine additionally includes a plurality of low-voltage wires generally located within the second member. The first member and the second member shielding the respective plurality of high-voltage wires and low-voltage wires to reduce electrical interference between the plurality of high-voltage wires and the plurality of low-voltage wires.

A method for manufacturing a gaming machine comprises providing a gaming cabinet having a first member and a second member. The first member being located physically separate from the second member. The method further comprises providing a plurality of high-voltage wires generally located within the first member and providing a plurality of low-voltage wires generally located within the second member. The first member and the second member shielding the respective plurality of high-voltage wires and low-voltage wires to reduce electrical interference between the plurality of high-voltage wires and the plurality of low-voltage wires.

A gaming machine for conducting a wagering game comprises a gaming cabinet. The gaming machine additionally includes a high-voltage channel and a low-voltage channel located within the gaming cabinet. The high-voltage channel is adapted to contain a plurality of high-voltage wires. The low-voltage channel is adapted to contain a plurality of low-voltage wires.

Additional aspects of the invention will be apparent to those of ordinary skill in the art in view of the detailed description of various embodiments, which is made with reference to the drawings, a brief description of which is provided below.

DETAILED DESCRIPTION

Figure 1A:
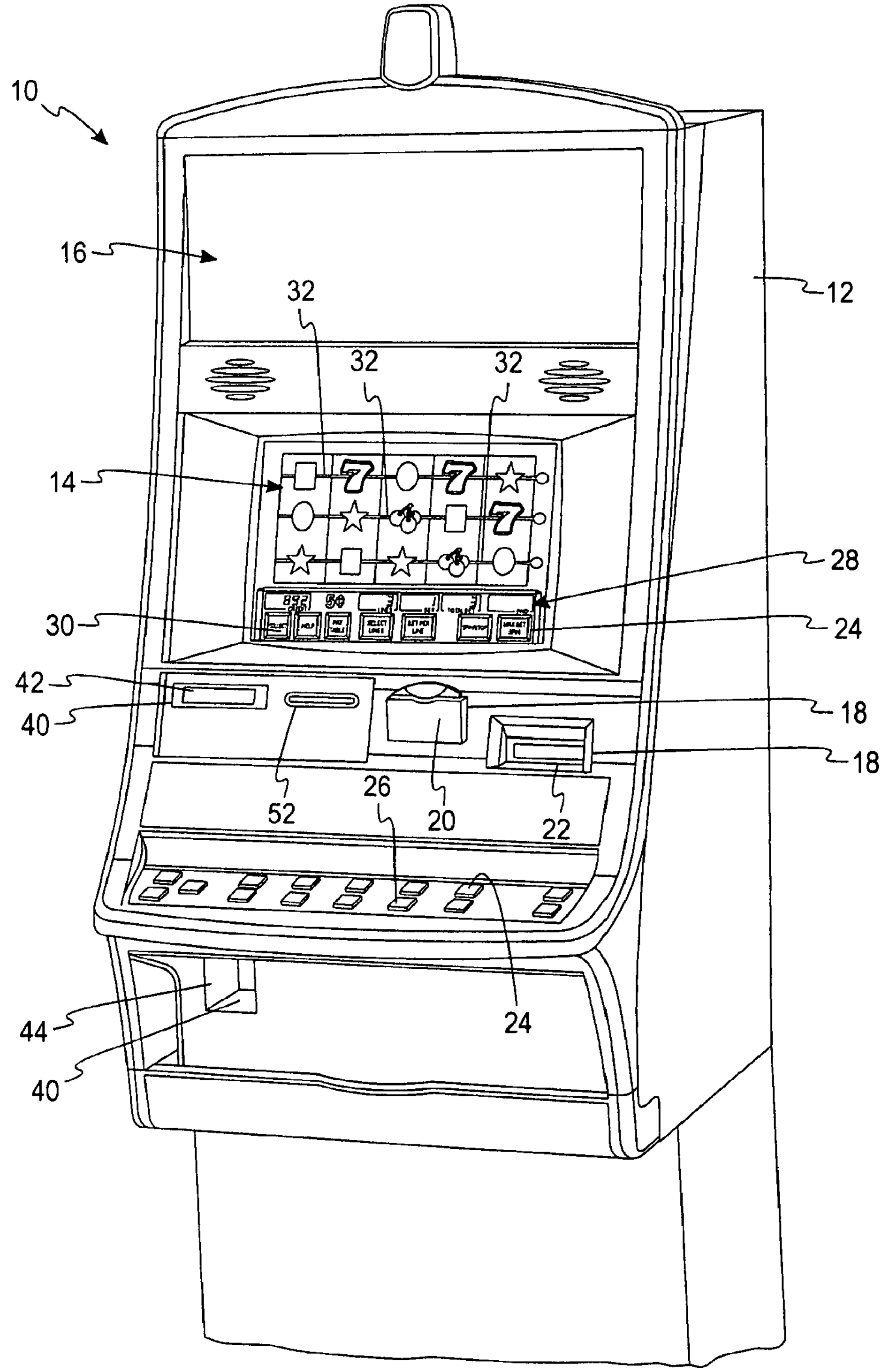
FIG. 1*a* is a perspective view of a free standing gaming machine embodying the present invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Referring to FIG. 1*a*, a gaming machine 10 is used in gaming establishments such as casinos. With regard to the present invention, the gaming machine 10 may be any type of gaming machine and may have varying structures and methods of operation. For example, the gaming machine 10 may be an electromechanical gaming machine configured to play mechanical slots, or it may be an electronic gaming machine configured to play a video casino game, such as blackjack, slots, keno, poker, blackjack, roulette, etc.

The gaming machine 10 comprises a housing 12 and includes input devices, including a value input device 18 and a player input device 24. For output the gaming machine 10 includes a primary display 14 for displaying information about the basic wagering game. The primary display 14 can also display information about a bonus wagering game and a progressive wagering game. The gaming machine 10 may also include a secondary display 16 for displaying game events, game outcomes, and/or signage information. While these typical components found in the gaming machine 10 are described below, it should be understood that numerous other elements may exist and may be used in any number of combinations to create various forms of a gaming machine 10.

The value input device 18 may be provided in many forms, individually or in combination, and is preferably located on the front of the housing 12. The value input device 18 receives currency and/or credits that are inserted by a player. The value input device 18 may include a coin acceptor 20 for receiving coin currency (see FIG. 1*a*). Alternatively, or in addition, the value input device 18 may include a bill acceptor 22 for receiving paper currency. Furthermore, the value input device 18 may include a ticket reader, or barcode scanner, for reading information stored on a credit ticket, a card, or other tangible portable credit storage device. The credit ticket or card may also authorize access to a central account, which can transfer money to the gaming machine 10.

The player input device 24 comprises a plurality of push buttons 26 on a button panel for operating the gaming machine 10. In addition, or alternatively, the player input device 24 may comprise a touch screen 28 mounted by adhesive, tape, or the like over the primary display 14 and/or secondary display 16. The touch screen 28 contains soft touch keys 30 denoted by graphics on the underlying primary display 14 and used to operate the gaming machine 10. The touch screen 28 provides players with an alternative method of input. A player enables a desired function either by touching the touch screen 28 at an appropriate touch key 30 or by pressing an appropriate push button 26 on the button panel. The touch keys 30 may be used to implement the same functions as push buttons 26. Alternatively, the push buttons 26 may provide inputs for one aspect of the operating the game, while the touch keys 30 may allow for input needed for another aspect of the game.

The various components of the gaming machine 10 may be connected directly to, or contained within, the housing 12, as seen in FIG. 1*a*, or may be located outboard of the housing 12 and connected to the housing 12 via a variety of different wired or wireless connection methods. Thus, the gaming machine 10 comprises these components whether housed in the housing 12, or outboard of the housing 12 and connected remotely.

The operation of the basic wagering game is displayed to the player on the primary display 14. The primary display 14 can also display the bonus game associated with the basic wagering game. The primary display 14 may take the form of a cathode ray tube (CRT), a high resolution LCD, a plasma display, an LED, or any other type of display suitable for use in the gaming machine 10. As shown, the primary display 14 includes the touch screen 28 overlaying the entire display (or a portion thereof) to allow players to make game-related selections. Alternatively, the primary display 14 of the gaming machine 10 may include a number of mechanical reels to display the outcome in visual association with at least one payline 32. In the illustrated embodiment, the gaming machine 10 is an "upright" version in which the primary display 14 is oriented vertically relative to the player. Alternatively, the gaming machine may be a "slant-top" version in which the primary display 14 is slanted at about a thirty-degree angle toward the player of the gaming machine 10.

A player begins play of the basic wagering game by making a wager via the value input device 18 of the gaming machine 10. A player can select play by using the player input device 24, via the buttons 26 or the touch screen keys 30. The basic game consists of a plurality of symbols arranged in an array, and includes at least one payline 32 that indicates one or more outcomes of the basic game. Such outcomes are randomly selected in response to the wagering input by the player. At least one of the plurality of randomly-selected outcomes may be a start-bonus outcome, which can include any variations of symbols or symbol combinations triggering a bonus game.

In some embodiments, the gaming machine 10 may also include a player information reader 52 that allows for identification of a player by reading a card with information indicating his or her true identity. The player information reader 52 is shown in FIG. 1*a* as a card reader, but may take on many forms including a ticket reader, bar code scanner, RFID transceiver or computer readable storage medium interface. Currently, identification is generally used by casinos for rewarding certain players with complimentary services or special offers. For example, a player may be enrolled in the gaming establishment's loyalty club and may be awarded certain complimentary services as that player collects points in his or her player-tracking account. The player inserts his or her card into the player information reader 52, which allows the casino's computers to register that player's wagering at the gaming machine 10. The gaming machine 10 may use the secondary display 16 or other dedicated player-tracking display for providing the player with information about his or her account or other player-specific information. Also, in some embodiments, the information reader 52 may be used to restore game assets that the player achieved and saved during a previous game session.

Figure 1B:
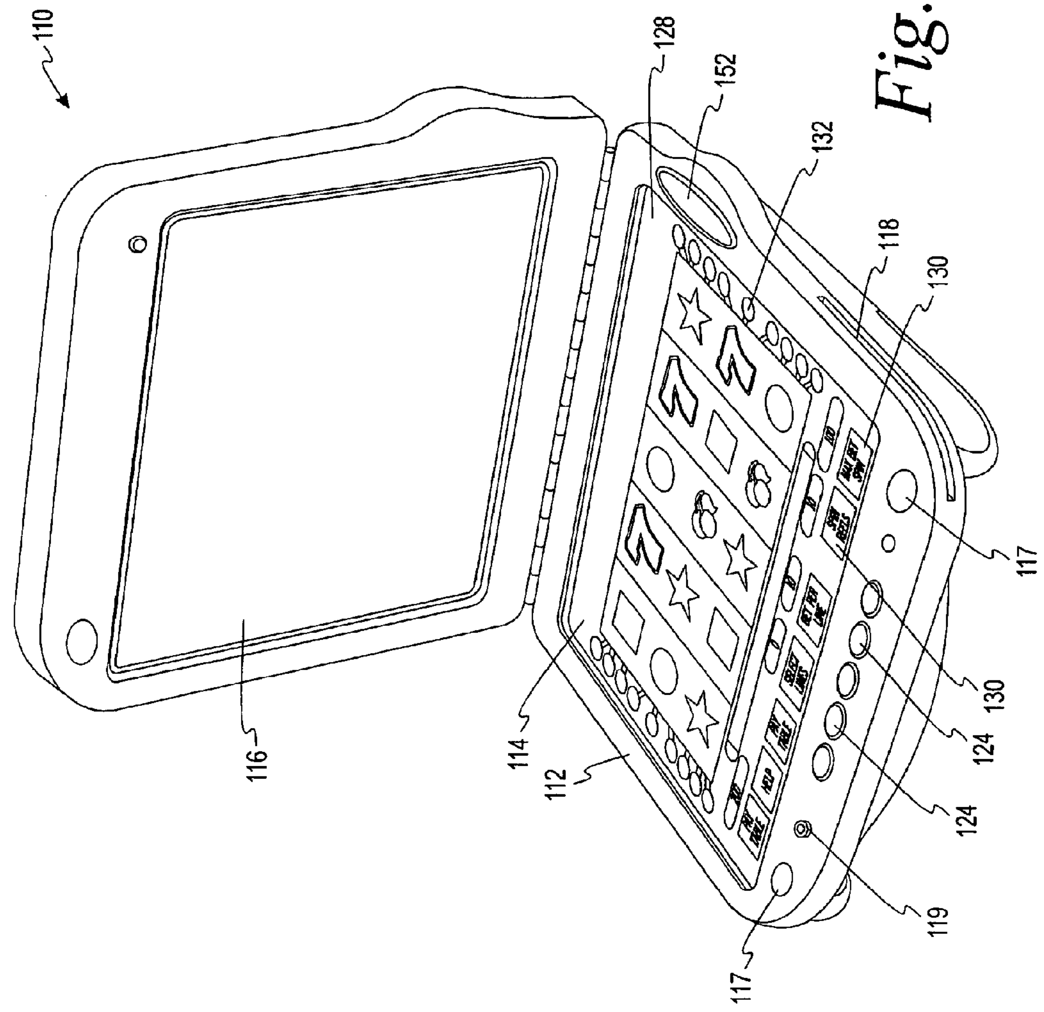
FIG. 1*b* is a perspective view of a handheld gaming machine embodying the present invention.

Depicted in FIG. 1*b* is a handheld or mobile gaming machine 110. Like the free standing gaming machine 10, the handheld gaming machine 110 is preferably an electronic gaming machine configured to play a video casino game such as, but not limited to, blackjack, slots, keno, poker, blackjack, and roulette. The handheld gaming machine 110 comprises a housing or casing 112 and includes input devices, including a value input device 118 and a player input device 124. For output the handheld gaming machine 110 includes, but is not limited to, a primary display 114, a secondary display 116, one or more speakers 117, one or more player-accessible ports 119 (e.g., an audio output jack for headphones, a video headset jack, etc.), and other conventional I/O devices and ports, which may or may not be player-accessible. In the embodiment depicted in FIG. 1*b*, the handheld gaming machine 110 comprises a secondary display 116 that is rotatable relative to the primary display 114. The optional secondary display 116 may be fixed, movable, and/or detachable/attachable relative to the primary display 114. Either the primary display 114 and/or secondary display 116 may be configured to display any aspect of a non-wagering game, wagering game, secondary games, bonus games, progressive wagering games, group games, shared-experience games or events, game events, game outcomes, scrolling information, text messaging, emails, alerts or announcements, broadcast information, subscription information, and handheld gaming machine status.

The player-accessible value input device 118 may comprise, for example, a slot located on the front, side, or top of the casing 112 configured to receive credit from a stored-value card (e.g., casino card, smart card, debit card, credit card, etc.) inserted by a player. In another aspect, the player-accessible value input device 118 may comprise a sensor (e.g., an RF sensor) configured to sense a signal (e.g., an RF signal) output by a transmitter (e.g., an RF transmitter) carried by a player. The player-accessible value input device 118 may also or alternatively include a ticket reader, or barcode scanner, for reading information stored on a credit ticket, a card, or other tangible portable credit or funds storage device. The credit ticket or card may also authorize access to a central account, which can transfer money to the handheld gaming machine 110.

Still other player-accessible value input devices 118 may require the use of touch keys 130 on the touch-screen display (e.g., primary display 114 and/or secondary display 116) or player input devices 124. Upon entry of player identification information and, preferably, secondary authorization information (e.g., a password, PIN number, stored value card number, predefined key sequences, etc.), the player may be permitted to access a player's account. As one potential optional security feature, the handheld gaming machine 110 may be configured to permit a player to only access an account the player has specifically set up for the handheld gaming machine 110. Other conventional security features may also be utilized to, for example, prevent unauthorized access to a player's account, to minimize an impact of any unauthorized access to a player's account, or to prevent unauthorized access to any personal information or funds temporarily stored on the handheld gaming machine 110.

The player-accessible value input device 118 may itself comprise or utilize a biometric player information reader which permits the player to access available funds on a player's account, either alone or in combination with another of the aforementioned player-accessible value input devices 118. In an embodiment wherein the player-accessible value input device 118 comprises a biometric player information reader, transactions such as an input of value to the handheld device, a transfer of value from one player account or source to an account associated with the handheld gaming machine 110, or the execution of another transaction, for example, could all be authorized by a biometric reading, which could comprise a plurality of biometric readings, from the biometric device.

Alternatively, to enhance security, a transaction may be optionally enabled only by a two-step process in which a secondary source confirms the identity indicated by a primary source. For example, a player-accessible value input device 118 comprising a biometric player information reader may require a confirmatory entry from another biometric player information reader 152, or from another source, such as a credit card, debit card, player ID card, fob key, PIN number, password, hotel room key, etc. Thus, a transaction may be enabled by, for example, a combination of the personal identification input (e.g., biometric input) with a secret PIN number, or a combination of a biometric input with a fob input, or a combination of a fob input with a PIN number, or a combination of a credit card input with a biometric input. Essentially, any two independent sources of identity, one of which is secure or personal to the player (e.g., biometric readings, PIN number, password, etc.) could be utilized to provide enhanced security prior to the electronic transfer of any funds. In another aspect, the value input device 118 may be provided remotely from the handheld gaming machine 110.

The player input device 124 comprises a plurality of push buttons on a button panel for operating the handheld gaming machine 110. In addition, or alternatively, the player input device 124 may comprise a touch screen 128 mounted to a primary display 114 and/or secondary display 116. In one aspect, the touch screen 128 is matched to a display screen having one or more selectable touch keys 130 selectable by a user's touching of the associated area of the screen using a finger or a tool, such as a stylus pointer. A player enables a desired function either by touching the touch screen 128 at an appropriate touch key 130 or by pressing an appropriate push button 126 on the button panel. The touch keys 130 may be used to implement the same functions as push buttons 126. Alternatively, the push buttons may provide inputs for one aspect of the operating the game, while the touch keys 130 may allow for input needed for another aspect of the game. The various components of the handheld gaming machine 110 may be connected directly to, or contained within, the casing 112, as seen in FIG. 1*b*, or may be located outboard of the casing 112 and connected to the casing 112 via a variety of hardwired (tethered) or wireless connection methods. Thus, the handheld gaming machine 110 may comprise a single unit or a plurality of interconnected parts (e.g., wireless connections) which may be arranged to suit a player's preferences.

The operation of the basic wagering game on the handheld gaming machine 110 is displayed to the player on the primary display 114. The primary display 114 can also display the bonus game associated with the basic wagering game. The primary display 114 preferably takes the form of a high resolution LCD, a plasma display, an LED, or any other type of display suitable for use in the handheld gaming machine 110. The size of the primary display 114 may vary from, for example, about a 2-3" display to a 15" or 17" display. In at least some aspects, the primary display 114 is a 7"-10" display. As the weight of and/or power requirements of such displays decreases with improvements in technology, it is envisaged that the size of the primary display may be increased. Optionally, coatings or removable films or sheets may be applied to the display to provide desired characteristics (e.g., anti-scratch, anti-glare, bacterially-resistant and anti-microbial films, etc.). In at least some embodiments, the primary display 114 and/or secondary display 116 may have a 16:9 aspect ratio or other aspect ratio (e.g., 4:3). The primary display 114 and/or secondary display 116 may also each have different resolutions, different color schemes, and different aspect ratios.

As with the free standing gaming machine 10, a player begins play of the basic wagering game on the handheld gaming machine 110 by making a wager (e.g., via the value input device 18 or an assignment of credits stored on the handheld gaming machine via the touch screen keys 130, player input device 124, or buttons 126) on the handheld gaming machine 110. In at least some aspects, the basic game may comprise a plurality of symbols arranged in an array, and includes at least one payline 132 that indicates one or more outcomes of the basic game. Such outcomes are randomly selected in response to the wagering input by the player. At least one of the plurality of randomly selected outcomes may be a start-bonus outcome, which can include any variations of symbols or symbol combinations triggering a bonus game.

In some embodiments, the player-accessible value input device 118 of the handheld gaming machine 110 may double as a player information reader 152 that allows for identification of a player by reading a card with information indicating the player's identity (e.g., reading a player's credit card, player ID card, smart card, etc.). The player information reader 152 may alternatively or also comprise a bar code scanner, RFID transceiver or computer readable storage medium interface. In one presently preferred aspect, the player information reader 152, shown by way of example in FIG. 1*b*, comprises a biometric sensing device.

Figure 2:
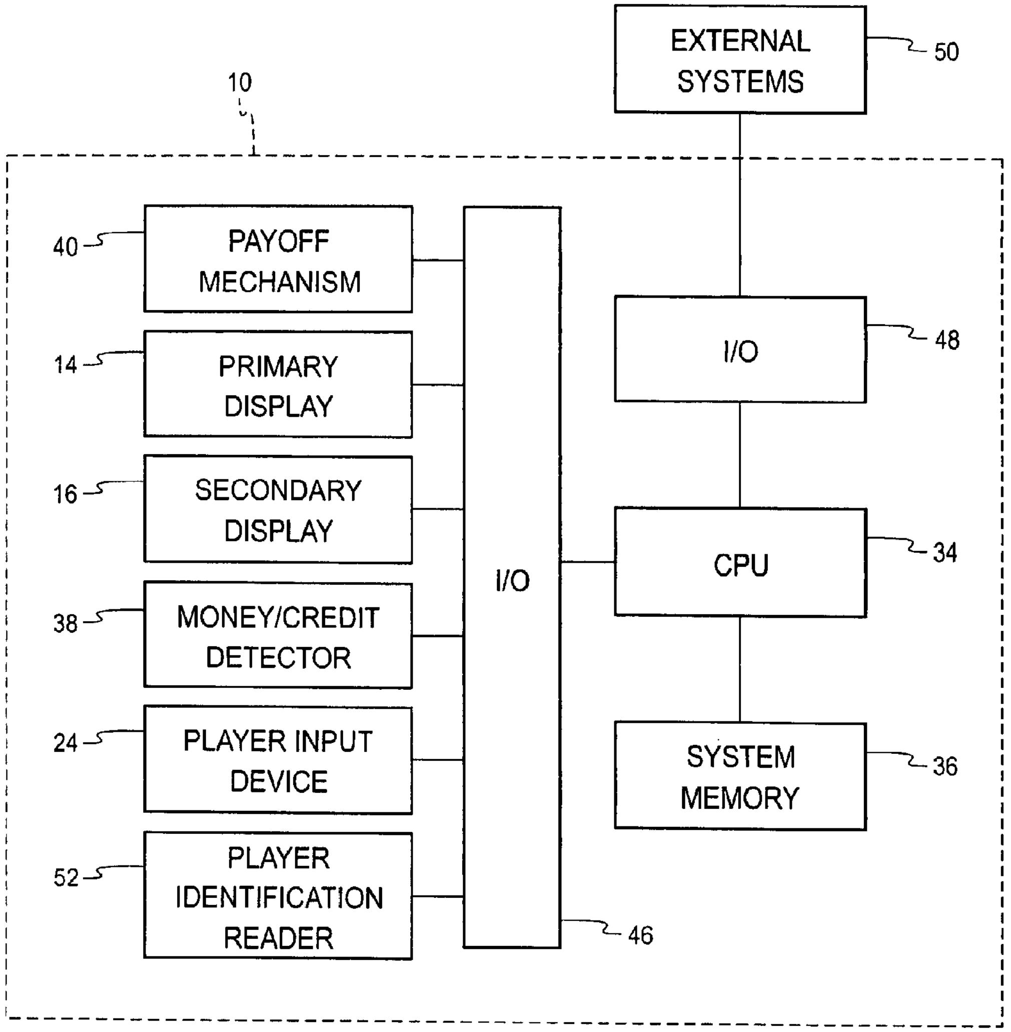
FIG. 2 is a block diagram of a control system suitable for operating the gaming machines of FIGS. 1*a* and 1*b*.

Turning now to FIG. 2, the various components of the gaming machine 10 are controlled by a central processing unit (CPU) 34, also referred to herein as a controller or processor (such as a microcontroller or microprocessor). To provide gaming functions, the controller 34 executes one or more game programs stored in a computer readable storage medium, in the form of memory 36. The controller 34 performs the random selection (using a random number generator (RNG)) of an outcome from the plurality of possible outcomes of the wagering game. Alternatively, the random event may be determined at a remote controller. The remote controller may use either an RNG or pooling scheme for its central determination of a game outcome. It should be appreciated that the controller 34 may include one or more microprocessors, including but not limited to a master processor, a slave processor, and a secondary or parallel processor.

The controller 34 is also coupled to the system memory 36 and a money/credit detector 38. The system memory 36 may comprise a volatile memory (e.g., a random-access memory (RAM)) and a non-volatile memory (e.g., an EEPROM). The system memory 36 may include multiple RAM and multiple program memories. The money/credit detector 38 signals the processor that money and/or credits have been input via the value input device 18. Preferably, these components are located within the housing 12 of the gaming machine 10. However, as explained above, these components may be located outboard of the housing 12 and connected to the remainder of the components of the gaming machine 10 via a variety of different wired or wireless connection methods.

As seen in FIG. 2, the controller 34 is also connected to, and controls, the primary display 14, the player input device 24, and a payoff mechanism 40. The payoff mechanism 40 is operable in response to instructions from the controller 34 to award a payoff to the player in response to certain winning outcomes that might occur in the basic game or the bonus game(s). The payoff may be provided in the form of points, bills, tickets, coupons, cards, etc. For example, in FIG. 1*a*, the payoff mechanism 40 includes both a ticket printer 42 and a coin outlet 44. However, any of a variety of payoff mechanisms 40 well known in the art may be implemented, including cards, coins, tickets, smartcards, cash, etc. The payoff amounts distributed by the payoff mechanism 40 are determined by one or more pay tables stored in the system memory 36.

Communications between the controller 34 and both the peripheral components of the gaming machine 10 and external systems 50 occur through input/output (I/O) circuits 46, 48. More specifically, the controller 34 controls and receives inputs from the peripheral components of the gaming machine 10 through the input/output circuits 46. Further, the controller 34 communicates with the external systems 50 via the I/O circuits 48 and a communication path (e.g., serial, parallel, IR, RC, 10bT, etc.). The external systems 50 may include a gaming network, other gaming machines, a gaming server, communications hardware, or a variety of other interfaced systems or components. Although the I/O circuits 46, 48 may be shown as a single block, it should be appreciated that each of the I/O circuits 46, 48 may include a number of different types of I/O circuits.

Controller 34, as used herein, comprises any combination of hardware, software, and/or firmware that may be disposed or resident inside and/or outside of the gaming machine 10 that may communicate with and/or control the transfer of data between the gaming machine 10 and a bus, another computer, processor, or device and/or a service and/or a network. The controller 34 may comprise one or more controllers or processors. In FIG. 2, the controller 34 in the gaming machine 10 is depicted as comprising a CPU, but the controller 34 may alternatively comprise a CPU in combination with other components, such as the I/O circuits 46, 48 and the system memory 36. The controller 34 may reside partially or entirely inside or outside of the machine 10. The control system for a handheld gaming machine 110 may be similar to the control system for the free standing gaming machine 10 except that the functionality of the respective on-board controllers may vary.

The gaming machines 10,110 may communicate with external systems 50 (in a wired or wireless manner) such that each machine operates as a "thin client," having relatively less functionality, a "thick client," having relatively more functionality, or through any range of functionality therebetween (e.g., a "rich client"). As a generally "thin client," the gaming machine may operate primarily as a display device to display the results of gaming outcomes processed externally, for example, on a server as part of the external systems 50. In this "thin client" configuration, the server executes game code and determines game outcomes (e.g., with a random number generator), while the controller 34 on board the gaming machine processes display information to be displayed on the display(s) of the machine. In an alternative "rich client" configuration, the server determines game outcomes, while the controller 34 on board the gaming machine executes game code and processes display information to be displayed on the display(s) of the machines. In yet another alternative "thick client" configuration, the controller 34 on board the gaming machine 110 executes game code, determines game outcomes, and processes display information to be displayed on the display(s) of the machine. Numerous alternative configurations are possible such that the aforementioned and other functions may be performed onboard or external to the gaming machine as may be necessary for particular applications. It should be understood that the gaming machines 10,110 may take on a wide variety of forms such as a free standing machine, a portable or handheld device primarily used for gaming, a mobile telecommunications device such as a mobile telephone or personal daily assistant (PDA), a counter top or bar top gaming machine, or other personal electronic device such as a portable television, MP3 player, entertainment device, etc.

Figure 3:
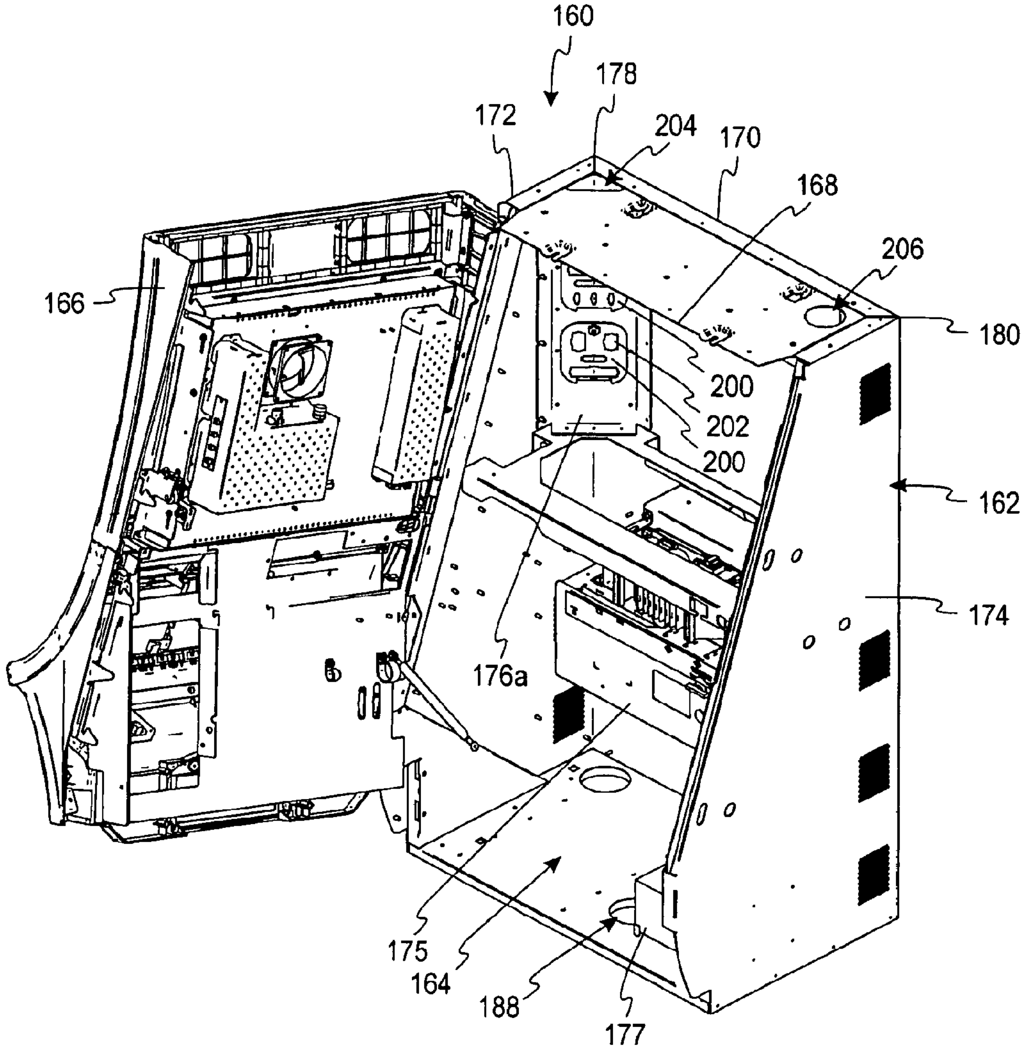
FIG. 3 is a perspective right-side view of a gaming cabinet showing a main door in an open position, according to one embodiment of the present invention.
Figure 4B:
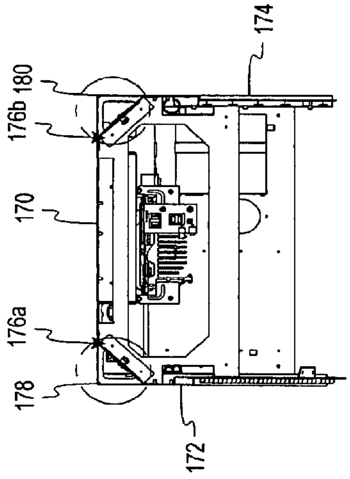
FIG. 4*b* is a top view showing interior components of the gaming cabinet of FIG. 3.
Figure 4C:
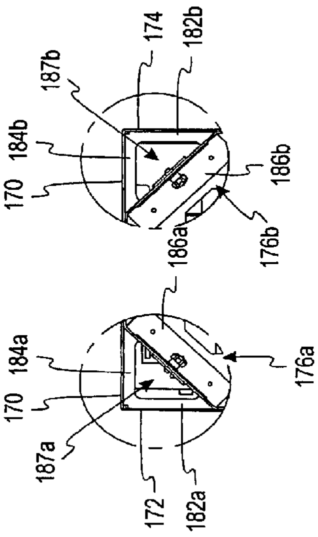
FIG. 4*c* is an enlarged view of structural members illustrated in FIG. 4*b*.
Figure 4A:
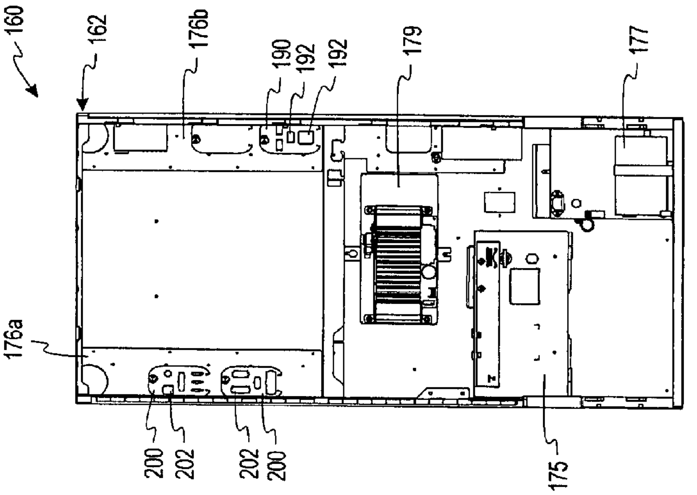
FIG. 4*a* is a front view of the gaming cabinet of FIG. 3 with the main door removed.
Figure 5:
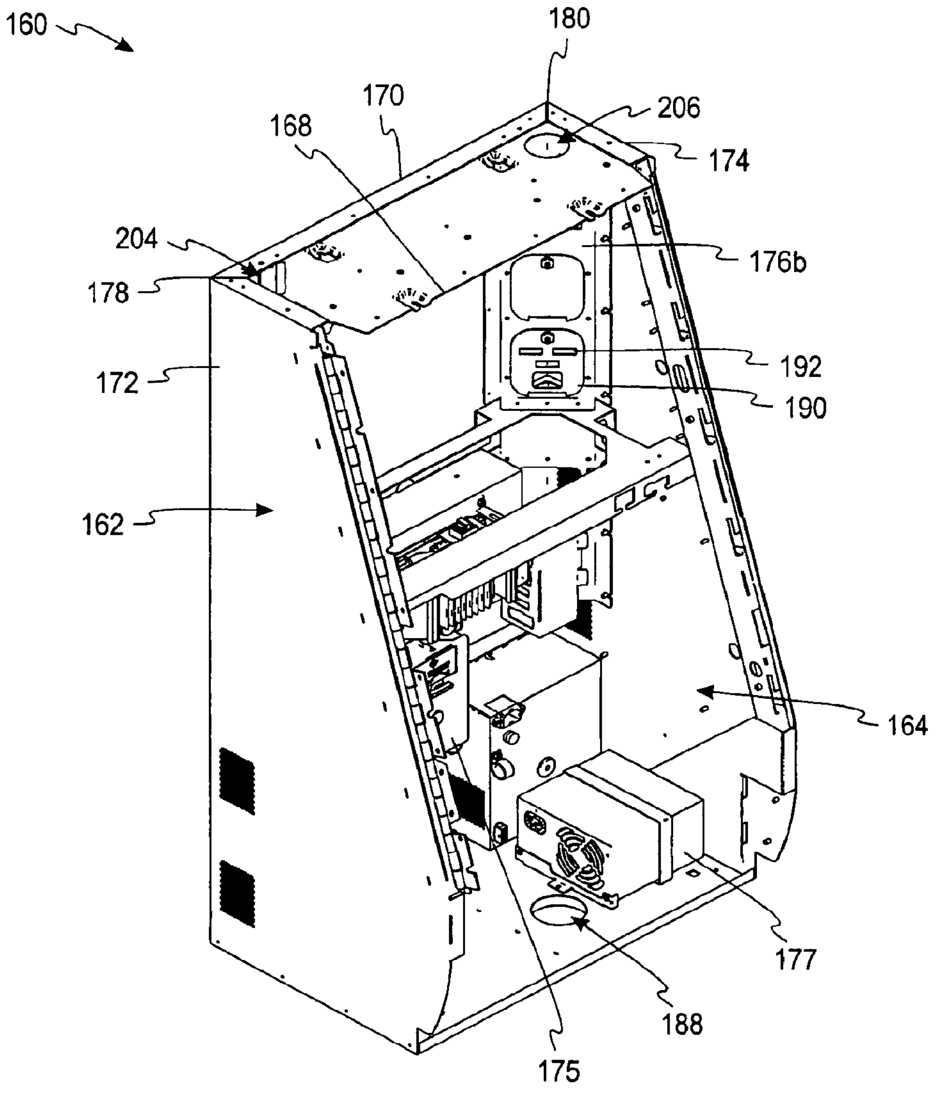
FIG. 5 is a perspective left-side view of the gaming cabinet of FIG. 3 showing the main door removed.
Figure 6:
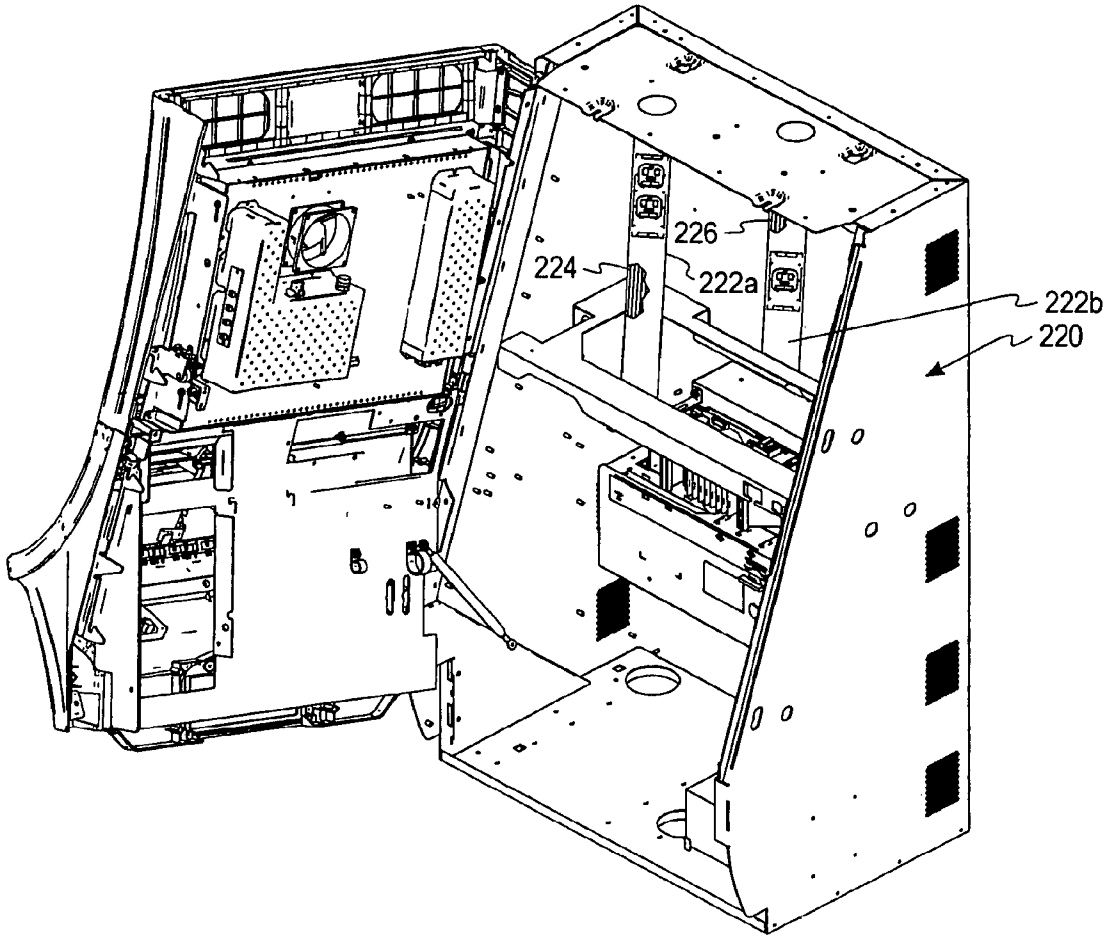
FIG. 6 is a perspective right-side view of a gaming cabinet, according to another embodiment of the present invention.
Figure 7A:
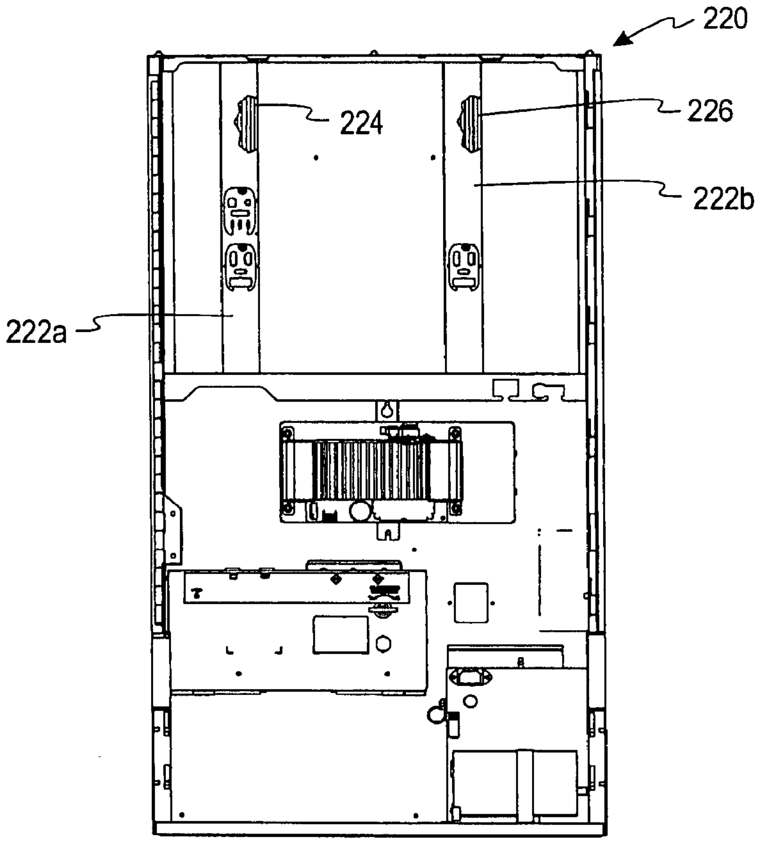
FIG. 7*a* is a front view the gaming cabinet of FIG. 6.
Figure 7B:
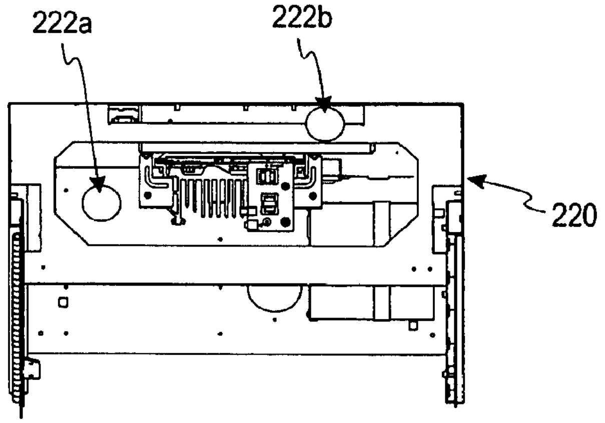
FIG. 7*b* is a top view showing interior components of the gaming cabinet of FIG. 6.

Turning now to FIGS. 3-5, a gaming machine 160 similar to the gaming machine 10 of FIG. 1*a* is shown according to one embodiment of the present invention. The gaming machine 160 includes a gaming cabinet 162, which generally surrounds an interior 164 of the gaming machine 160 and is viewable by players. The gaming cabinet 162 includes a main door 166 on the front of the gaming machine 160, which opens to provide access to the interior 164 of the gaming machine 160. FIG. 3 shows the cabinet 162 with the main door 166 open, and FIGS. 4*a*-*c* and 5 show the cabinet 162 with the main door 166 removed (for clarity). Components such as push buttons 24, the bill acceptor 22, the coin outlet 44, and the like (shown in FIG. 1*a*) may be attached to the main door 166.

When closed, the main door 166 is positioned (or aligned) along a first edge 168 of the gaming cabinet 162 generally opposite a rear wall 170 of the gaming cabinet 162. A first side wall 172 and a second side wall 174, generally opposite one another, are connected to the first edge 168 and the rear wall 170 of the gaming cabinet 162, as illustrated in FIGS. 4-7. The exterior of the gaming cabinet 162 may have other shapes than those illustrated in the FIGS. 4-7.

Various components are mounted within the gaming cabinet 162. For purposes of clarity, however, only some components are shown. For example, the CPU 34 (referred to in FIG. 2) is mounted within a CPU box that is designed to fit within a CPU enclosure 175. Other components mounted within the gaming cabinet 162 may include two power supplies such as a primary power supply 177 and an auxiliary power supply 179.

The gaming cabinet 162 includes a first structural member 176*a* and a second structural member 176*b* to increase the strength and/or stability of the gaming cabinet 162. In the illustrated embodiments, the first structural member 176*a* is generally disposed in a first corner 178, formed by the intersection of the first side wall 172 and the rear wall 170. The second structural member 176*b* is generally disposed in a second corner 180, formed by the intersection of the second side wall 174 and the rear wall 170.

In one embodiment, the first and second structural members 176*a*, 176*b* have, optionally, a triangular shape, shown best in FIG. 4*c*. The first structural member 176*a* has a first structural member side 182*a*, a second structural member side 184*a*, and third structural member side 186*a*. The first structural member side 182*a* is generally aligned with the first side wall 172 of the gaming cabinet 162, the second structural member side 184*a* is generally aligned with the rear wall 170 of the gaming cabinet 162, and the third structural member side 186*a* is traversely oriented with respect to both the first side wall 172 and the rear wall 170, as illustrated best in FIG. 4*c*.

The second structural member 176*b* includes a first structural member side 182*b*, a second structural member side 184*b*, and a third structural member side 186*b*. The first structural member side 182*b* is aligned with the second side wall 174 of the gaming cabinet 162, the second structural member side 184*b* is aligned with the rear wall 170 of the gaming cabinet 162, and the third structural member side 186*b* is traversly oriented with respect to both the second side wall 174 and the rear wall 170 of the gaming cabinet 162. Although the first structural member 176*a* and the second structural member 176*b* have been described as being generally identical, in alternative embodiments they may be different from each other.

The first and second structural members 176*a,b* may be comprised of a rigid material adapted to assist in providing stability to the gaming cabinet 162 and, optionally, to provide resistance to adverse environmental conditions (e.g., rust-free). For example, the first and second structural members 176*a*, 176*b* can be made using galvanized steel. In other embodiments, the first and second structural member 176*a*, 176*b* can be made using cold rolled steel, plated steel, stainless steel, aluminum, or a conductive material-containing plastic.

The first and second structural members 176*a*, 176*b* assist in providing support in the corners 178, 180 of the gaming cabinet 162. Movement of the first side wall 172 and the second side wall 174 with respect to the rear wall 170 is greatly reduced, if not completely eliminated, as a result of the presence of the first and second structural members 176*a*, 176*b*. Thus, when the main door 166 is opened and closed, the gaming cabinet 162 is prevented from "rocking," remaining generally stationary and sturdy.

The structural members 176*a*, 176*b* include respective interior spaces 187*a*, 187*b* (shown in FIG. 4*c*) for containing wires typically used and included within gaming machines. For example, the wires include DC wires, such as signal wires and input/output wires, which are used to deliver low-voltage power and provide operational control of the gaming machine 160. Other wires include AC wires, which are used to transfer high-voltage power to the gaming machine 160.

The DC wires, including signal and input/output wires, are generally contained within the interior 187*a* of the first structural member 176*a*. The AC wires are generally contained within the interior 187*b* of the second structural member 176*b*. Separating the AC wires from the DC wires eliminates, or greatly reduces, electromagnetic interference (EMI) and electrostatic discharge (ESD) that can occur when the wires are bundled together. Additionally, the physical enclosure provided by the first and second structural members 176*a*, 176*b* results in further shielding from the effects of EMI and ESD. For example, using galvanized steel, which is a conductive material, assists in providing shielding from EMI and ESD.

In the illustrated embodiments, the wires are received into the gaming cabinet 162 through a hole 188 on the bottom of the gaming cabinet 162. However, other locations of receiving the wires into the gaming cabinet 162 are alternatively, or optionally, contemplated. The DC wires are directed into the first structural member 176*a* and the AC wires are directed into the second structural member 176*b*. Where desired, the wires may be directed from the first and second structural members 176*a*, 176*b* into a top box (not illustrated) through openings 204 and 206. Specifically, the DC wires may enter the top box through the opening 204 and the AC wires may enter the top box through opening 206. The top box sits on top of the gaming machine 160 and is generally used to display graphics and other information about the gaming machine 160.

To associate the plurality of wires to the various components of the gaming machine 160 and distribute operational control and power to the gaming machine 160, the first structural member 176*a* includes at least one DC connector plate 200 and the second structural member 176*b* includes at least one AC connector plate 190. The DC connector plates 200 and the AC connector plates 190 are made using a zinc-plated material. Alternatively, the DC connector plates 200 and/or the AC connector plates 190 can be made using other materials, preferably having conductive and/or corrosion resistant properties. In some embodiments, the DC connector plates 200 and the AC connector plates 190 could be made using cold rolled steel, plated steel, stainless steel, aluminum or conductive material-containing plastic. Also, throughout the application zinc-plated and galvanized steel may be used interchangeably from a functional standpoint.

The DC connector plates 200 and the AC connector plates 190 are modular plates enabling the change of electrical/signal connectors without having to change other members or components of the gaming cabinet 162. In general, the connector plates 190, 200 include a plurality of apertures in which connector receptacles are inserted. The connector receptacles are used to connect electrically supplying wire (e.g., DC or AC wire) from within the structural members 176*a*, 176*b* with electrical component wires from within the gaming cabinet 162. Thus, if a first electrical component having a first electrical connector is changed with a second electrical component having a second electrical connector that is different than the first electrical connector, the only modification to the gaming cabinet 160 may be to replace an inappropriate connector plate with an appropriate connector plate that can accommodate the second electrical connector. For example, to power the primary display 14, an electrical component wire extends from the primary display 14 to the AC connector plate 190. In some circumstances, it may be desirable to change the primary display 14 with a different type of display that is adapted to provide better image quality. The different type of display may require a larger amount of power deliverable by a different type of electrical component wire that is not adapted to attach to the connector plate 190. Thus, the connector plate 190 may be switched with a different connector plate that can accommodate the different type of electrical component wire.

The DC connector plates 200 and the AC connector plates 190 are removable from the first and second structural members 176*a*, 176*b* without the use of a tool. In other words, the connector plates 190, 200 are removably secured to the respective structural members 176*a*, 176*b* with fasteners that can be manually attached/removed without requiring a tool. For example, the fastener can include a knob attached to a threaded rod, wherein the knob is used to screw/unscrew the rod when attaching/removing the connector plates 190, 200.

The DC connector plate 200 includes at least one connector 202, which is electrically connected to at least one DC wire, such as a signal wire or input/output wires. The wires are located on the side of the DC connector plate 200 facing the first structural member 176*a*. Various components such as the CPU 34 in the CPU enclosure 175 may then be associated with the DC wires via the connectors 202 on the side of the signal connector plates 200 facing away from the first structural member 176*a*.

Similar to the DC connector plate 200, the AC connector plate 190 includes at least one connector 192, which is associated with at least one AC wire on the side of the AC connector plate 190 facing the structural member 176*b*. The primary power supply 177 and auxiliary power supply 179 may be associated with the AC wires via the connectors 192 on the side of the AC connector plates 190 facing away from the second structural member 176*b*.

Although the above-described plurality of wires have been described as being received within structural members 176*a*, 176*b*, the wires can be received into other types of members that do not necessarily provide structural strength and/or stability to the gaming cabinet. The wires may be separated into other types of rigid conduits, flexible conduits, or channels. For example, referring now to FIGS. 6 and 7*a*-*b*, a gaming cabinet 220 is illustrated having channels 222*a* and 222*b*. Channel 222*a* contains the DC wires (labeled with reference numeral 224) while channel 222*b* contains the AC wires (illustrated with reference numeral 226). In this embodiment, the structural channels 222*a*, 222*b* are circular, rigid channels generally disposed within the gaming cabinet 220. However, as mentioned above, the channels 222*a*, 222*b* can take other shapes and be located in other positions within the gaming cabinet 220 so long as the AC wires remain separated from the DC wires.

Each of these embodiments and obvious variations thereof is contemplated as falling within the spirit and scope of the claimed invention, which is set forth in the following claims.

What is claimed is:

1. A gaming machine for conducting a wagering game comprising:

- a gaming cabinet having a first member and a second member, both the first member and the second member being structural members, the first member being located physically separate from the second member;
- a plurality of high-voltage wires generally located within the first member; and
- a plurality of low-voltage wires generally located within the second member, the first member and the second member shielding the respective plurality of high-voltage wires and low-voltage wires to reduce electrical interference between the plurality of high-voltage wires and the plurality of low-voltage wires.

2. The gaming machine of claim 1, wherein the plurality of low-voltage wires includes a plurality of operational control wires.

3. The gaming machine of claim 1, wherein the gaming cabinet includes a first side generally opposite a second side, the first member being located near the first side of the gaming cabinet and the second member being located near the second side of the gaming cabinet.

4. The gaming machine of claim 1, wherein the first and second members are flexible conduits.

5. The gaming machine of claim 1, wherein the first and second members are rigid members.

6. The gaming machine of claim 1, wherein the first and second members are made using a material adapted to assist in reducing at least one of electromagnetic interference and electrostatic discharge.

7. The gaming machine of claim 1, wherein the first and second members are made using galvanized steel.

8. The gaming machine of claim 1, wherein the first and second members are positioned within the gaming cabinet to maximize the space for other components.

9. The gaming machine of claim 8, wherein the gaming cabinet includes four corners, the first and second members being located in two of the corners to maximize the space for the other components.

10. The gaming machine of claim 9, wherein the two corners having the first and second member are located in the rear of the gaming cabinet, opposite a front door.

11. The gaming cabinet of claim 10, wherein the first and second members are triangular in shape correspondingly fitting into the two corners located in the rear of the gaming cabinet.

12. A method for manufacturing a gaming machine comprising:

providing a gaming cabinet having a first member and a second member, both the first member and the second member being structural members, the first member being located physically separate from the second member;

inserting a plurality of high-voltage wires within the first member; and inserting a plurality of low-voltage wires within the second member, the first member and the second member shielding the respective plurality of high-voltage wires and low-voltage wires to reduce electrical interference between the plurality of high-voltage wires and the plurality of low-voltage wires.

13. The method of claim 12, wherein the plurality of high-voltage wires and the plurality of low-voltage wires are inserted through an end of the first and second members, the plurality of high-voltage wires and the plurality of low-voltage wires being attached to a connector in a first plate on the first and second members.

14. The method of claim 13, further comprising replacing the first plate with a second plate to accommodate a new connector.

15. The method of claim 12, wherein the plurality of high-voltage wires are AC wires and the plurality of low-voltage wires are DC wires.

16. A gaming machine for conducting a wagering game comprising:

a gaming cabinet;

a high-voltage channel located with in the gaming cabinet, the high-voltage channel being a structural member, the high-voltage channel containing a plurality of high-voltage wires; and a low-voltage channel located within the gaming cabinet, the low-voltage channel being a structural member, the low-voltage channel containing a plurality of low-voltage wires.

17. The gaming machine of claim 16, wherein the high-voltage channel and the low-voltage control channel are disposed at opposite ends of the gaming cabinet.

18. The gaming machine of claim 16, wherein the high-voltage channel and the low-voltage channel are made using a conductive material.

19. The gaming machine of claim 18, wherein the high-voltage channel and the low-voltage channel are made using galvanized steel.

20. The gaming machine of claim 16, wherein the plurality of low-voltage wires include an operational control wire.

* * * * *